United States Patent [19]

Yang

[11] Patent Number: 5,759,282
[45] Date of Patent: Jun. 2, 1998

[54] PROCESS FOR EVENLY DEPOSITING IONS USING A TILTING AND ROTATING PLATFORM

[75] Inventor: Ming-Tzung Yang, Hsinchu, Taiwan

[73] Assignee: United Microelectronics Corporation, Hsin-Chu, Taiwan

[21] Appl. No.: 792,764

[22] Filed: Feb. 4, 1997

Related U.S. Application Data

[60] Continuation of Ser. No. 456,175, May 30, 1995, abandoned, which is a division of Ser. No. 324,134, Oct. 17, 1994, abandoned.

[51] Int. Cl.⁶ ............................................. C23C 16/00
[52] U.S. Cl. ...................... 118/729; 118/730; 118/723 E
[58] Field of Search .................. 118/723 E, 723 ER, 118/723 MW, 723 FI, 723 FE, 729, 730; 156/345; 204/298.15, 298.28

[56] References Cited

U.S. PATENT DOCUMENTS

| | | | |
|---|---|---|---|
| 4,714,536 | 12/1987 | Freeman et al. | 204/298 |
| 4,979,467 | 12/1990 | Kamaji et al. | 118/723 |
| 5,081,069 | 1/1992 | Parker et al. | 437/235 |
| 5,260,106 | 11/1993 | Kawarada et al. | 427/577 |

FOREIGN PATENT DOCUMENTS

62-149870  3/1987  Japan.

OTHER PUBLICATIONS

Solid State Electronic Devices, Second Edition, Prentice-Hall, Inc., by Ben G. Streetman, pp. 20–22.

*Primary Examiner*—John Niebling
*Assistant Examiner*—Jori Y. Chang
*Attorney, Agent, or Firm*—Meltzer, Lippe, Goldstein, Wolf & Schlissel, P.C.

[57] ABSTRACT

A process for depositing a layer of uniform thickness on an uneven surface of a substrate is disclosed. The layer could be deposited by plasma or chemical vapor deposition (CVD). The uneven surface of the substrate has horizontal surfaces and vertical sidewalls and is located on a movable platform. The platform is tilted and rotated as the layer is deposited so that the ions or the flow of chemical vapor reaches the horizontal surface and the sidewall at a similar incident angle. Thereby, the layer is evenly deposited and has a uniform thickness with proper coverage and planarization.

2 Claims, 5 Drawing Sheets

PROCESS FOR EVENLY DEPOSITING IONS USING A TILTING AND ROTATING PLATFORM

This is a division of application Ser. No. 08/324,134, filed Oct. 17, 1994.

This is a continuation application of prior application, Ser. No. 08/456,175 filed May 30, 1995 abandoned, which was a divisional of parent application Ser. No. 08/324,134 filed Oct. 17, 1994, abandoned.

FIELD OF THE INVENTION

The present invention relates to a device and a process for evenly depositing a layer of uniform thickness on a substrate or a semiconductor wafer having an uneven surface with sidewalls. This invention overcomes the difficulty of depositing a layer on the sidewalls at the same rate as the layer deposition on the remaining surfaces.

BACKGROUND OF THE INVENTION

A conventional process for the deposition of a layer 10 is shown in FIG. 1. A silicon substrate 1 is mounted on a cathode 2 for depositing thereon the layer 10 by plasma. An RF source 3 is connected between the cathode 2 and an anode 4 acting as an ion source. The anode 4 is fixed in a horizontal position parallel to the cathode 2. The RF source 3 causes positive ions 5 to flow from the anode 4 to the silicon substrate 1 mounted on the cathode 2. Upon reaching the silicon substrate 1, the ions 5 react with the substrate material itself or with another layer previously deposited on the substrate to form the layer 10. The ion flow direction 6 is perpendicular to the silicon substrate 1 which is mounted on the cathode 2.

Often, ions 5 are deposited on a substrate or a silicon wafer having an uneven surface, such as a stepped surface 7 shown in FIG. 2. The stepped surface 7 has horizontal sections 8 and vertical sidewalls 9. Therefore, the ion flow direction 6 is parallel to the sidewalls 9 and perpendicular to the horizontal surfaces 8. Because the ion flow direction 6 is different with respect to the horizontal surfaces and sidewalls, the rate of deposition of the layer 10 on the sidewalls 9 is different than the deposition rate on the horizontal sections 8. The deposition rate is slower at the sidewalls 9 and faster at the horizontal surfaces 8. Therefore, coverage and planarization is poor. That is, the thickness of the deposited layer 10 is not uniform throughout the stepped surface 7. As shown in FIG. 2, the thickness 11 of the layer 10 above the horizontal surfaces 8 is greater than the layer's thickness 12 adjacent to the sidewalls 9.

It is an object of the present invention to overcome the problem of unequal rate of layer deposition on the horizontal and vertical surfaces.

SUMMARY OF THE INVENTION

The present invention achieves this objective and others by providing a process for evenly depositing a layer on a substrate having an uneven surface. Therefore, proper planarization is achieved in a shorter time, because the thickness of the deposited layer is equal throughout the uneven surface.

In one embodiment of the present invention, a plasma process is provided for evenly depositing a layer on the uneven surface of a semiconductor wafer or a substrate. This process includes the following steps. An RF source is connected to a first electrode, which serves as an ion source, and a second electrode so that ions flow from the first electrode to the second electrode. The two electrodes are, for example, parallel to each other. Depending on whether the ions are positive or negative, the first electrode, which serves as an ion source, may be the anode or the cathode.

A semiconductor or other substrate having an uneven surface is placed on a rotatable tilted platform located between the two parallel electrodes. The substrate is in electrical contact with the second electrode, e.g. the cathode in the case of positive ions. To deposit a layer of uniform thickness on the uneven surface of the substrate, the platform is tilted with respect to the direction of the ion flow. Furthermore, the tilted platform rotates about an axis parallel to the flow direction of the ions so that the ions reach all areas of the uneven surface at a similar angle of incidence.

Instead of being located in the space between the two electrodes, the platform supporting the substrate may be located outside of this space adjacent to one of the electrodes. For example, ions may flow from an anode, through a cathode or grid with openings to a substrate located adjacent to the cathode or grid.

In yet another embodiment of the present invention, the process for evenly depositing the layer on the uneven surface is by chemical vapor deposition (CVD). In this case, the substrate having the uneven surface is mounted on a platform which is tilted with respect to a direction of chemical vapor flow and rotated about an axis parallel to the direction of chemical vapor flow. The chemical vapor flow reaches all areas of the uneven surface of the substrate at a similar angle of incidence and thus forms a layer of uniform thickness.

DETAILED DESCRIPTION OF THE INVENTION

The process according to this invention for depositing a layer 102 of uniform thickness on a substrate 101 having an uneven surface 107 is shown in FIGS. 3 to 8. FIGS. 3a–b show a cross-section view of one embodiment of the present invention using plasma for the deposition of the layer 102.

Figure 1:
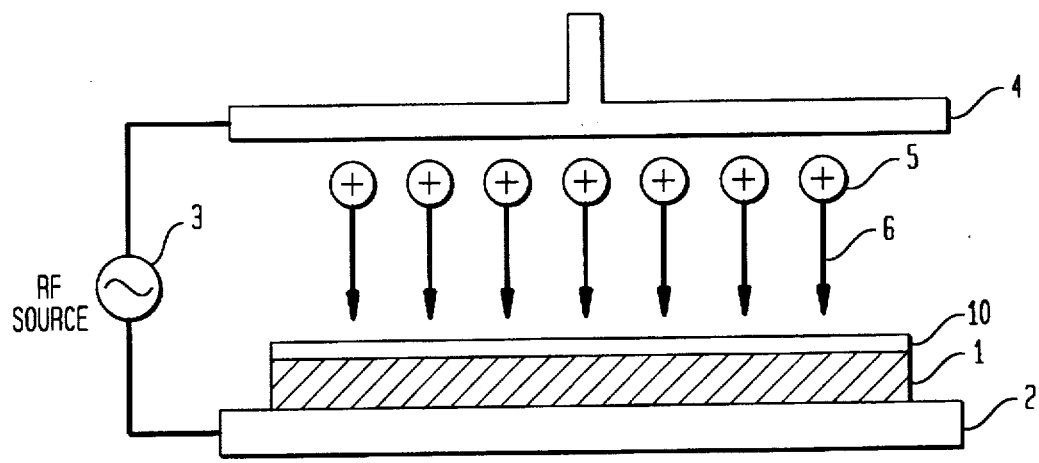
FIG. 1 illustrates a conventional process for depositing ions on a horizontal surface.
Figure 2:
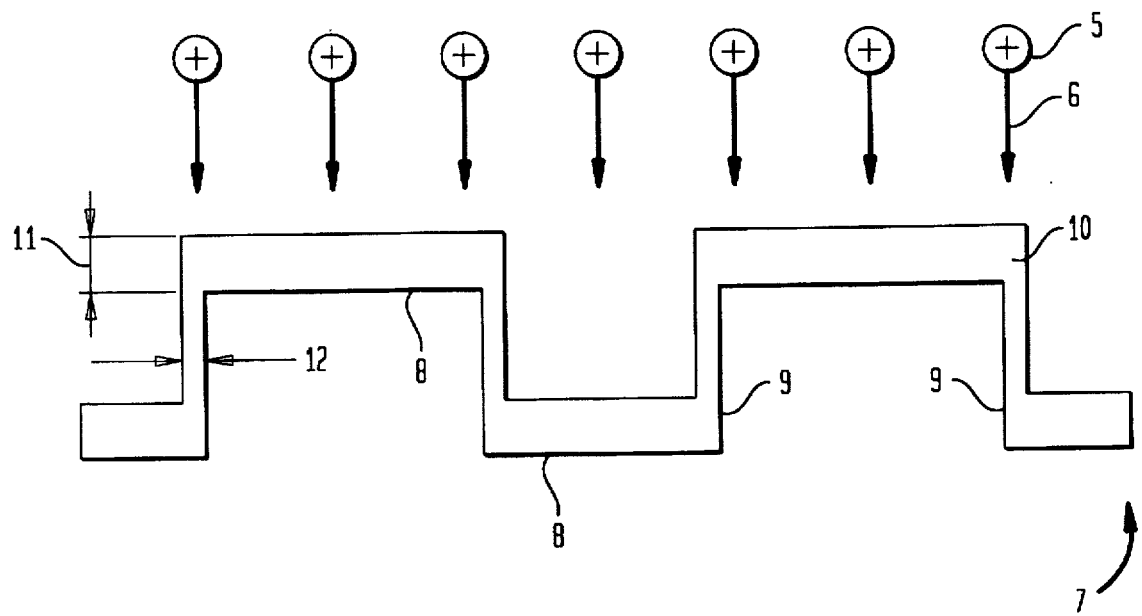
FIG. 2 illustrates a conventional ion deposition process on a stepped surface.
Figure 3A:
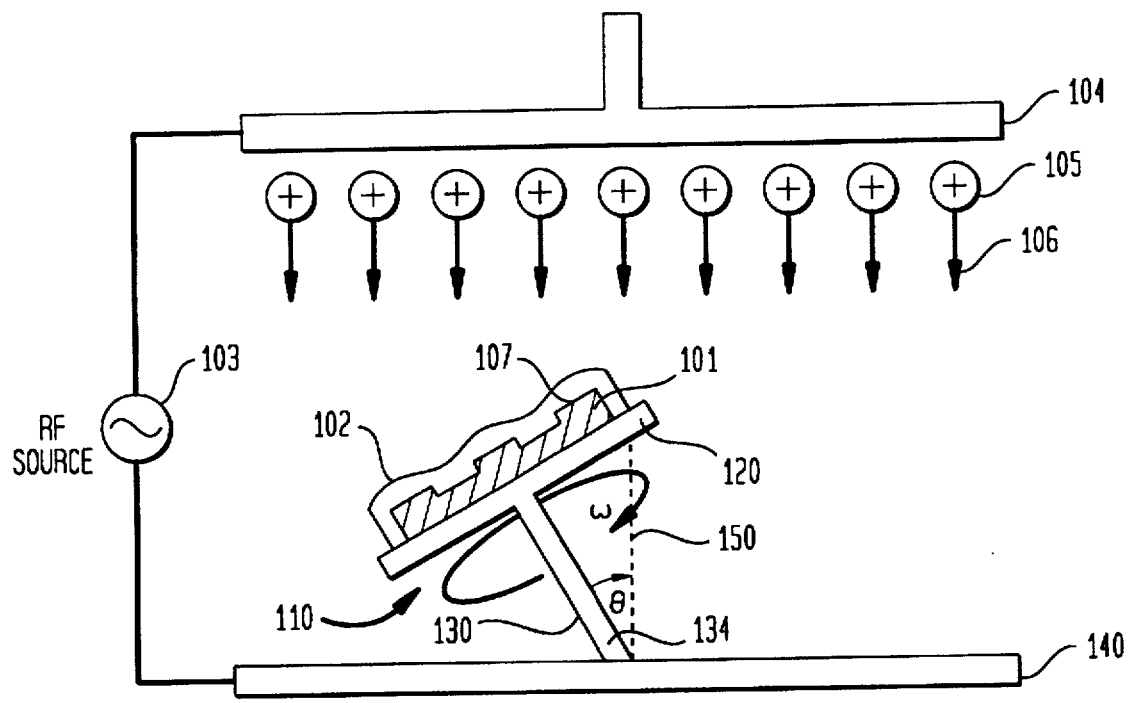
FIGS. 3a–b illustrate the process of the present invention using plasma wherein the platform is located between the two electrodes.

As shown in FIG. 3a, the process begins by connecting an RF source 103 between an anode 104, being a positive ion source, and a cathode 140. The cathode 140 could be grounded or isolated from ground. The two electrodes 104, 140 are parallel to each other. A platform 110, having a surface 120 and a shaft 130, is placed between the two parallel electrodes 104, 140.

The shaft 130 electrically connects the surface 120 to the cathode 140. Alternatively, the two electrodes can be interchanged. That is, the shaft 130 could be attached and electrically connected to the anode 104 and the cathode 140 could act as a source of negatively charged ions.

A substrate 101 having a stepped surface 107 is placed on the surface 120. The substrate 101 is in electrical contact with the surface 120 which is in turn electrically connected to the cathode 140 through the shaft 130. Because the substrate 101 is in electrical contact with the cathode 140, the ions 105, emanating from the anode 104, are attracted to the substrate 101. Upon reaching the substrate 101, the ions 105 are neutralized during an ensuing chemical reaction which leads to the deposition of a layer 102 on the stepped surface 107 of the substrate 101.

Figure 3B:
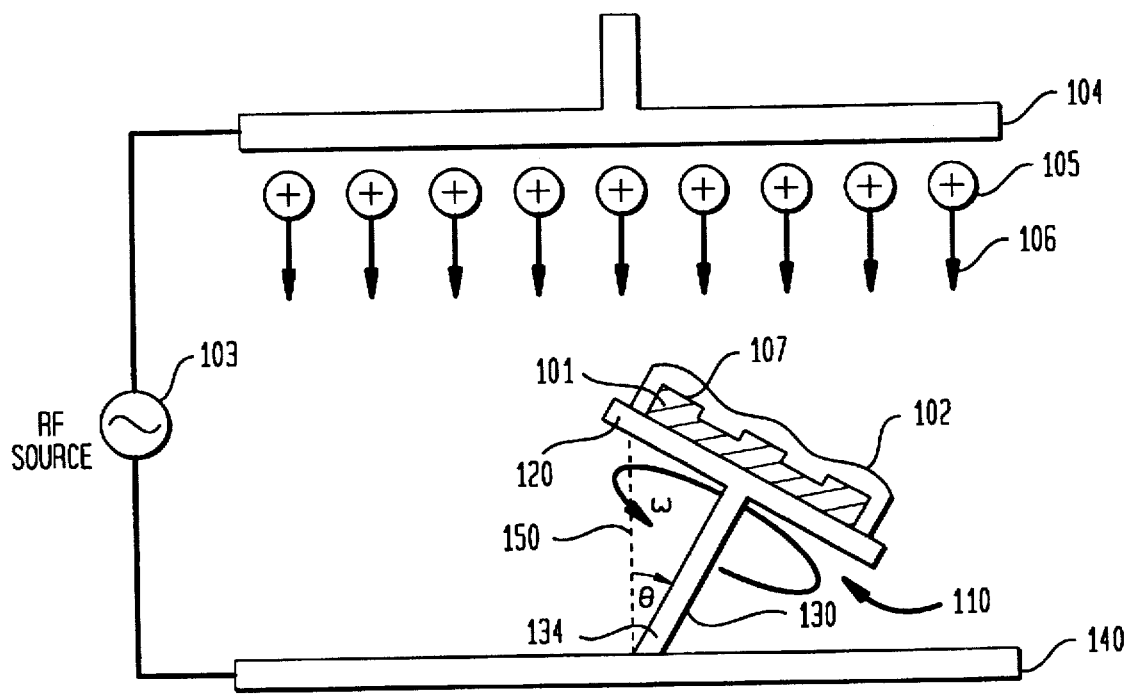

FIG. 3a–b show the positive ions flowing from the anode 104 to the cathode 140. The flow direction 106 of the ions 105 is perpendicular to the two parallel electrodes 104, 140. The platform 110 is tilted by angle θ with respect to the direction of ion flow. Furthermore, as the ions 105 flow toward the stepped surface 107, the platform 110 rotates with angular velocity ω about an axis 150. The axis 150 is parallel to the direction of ion flow. FIGS. 3a–b show the location of the platform 110 after a 180 degree rotation about the axis 150.

Figure 4:
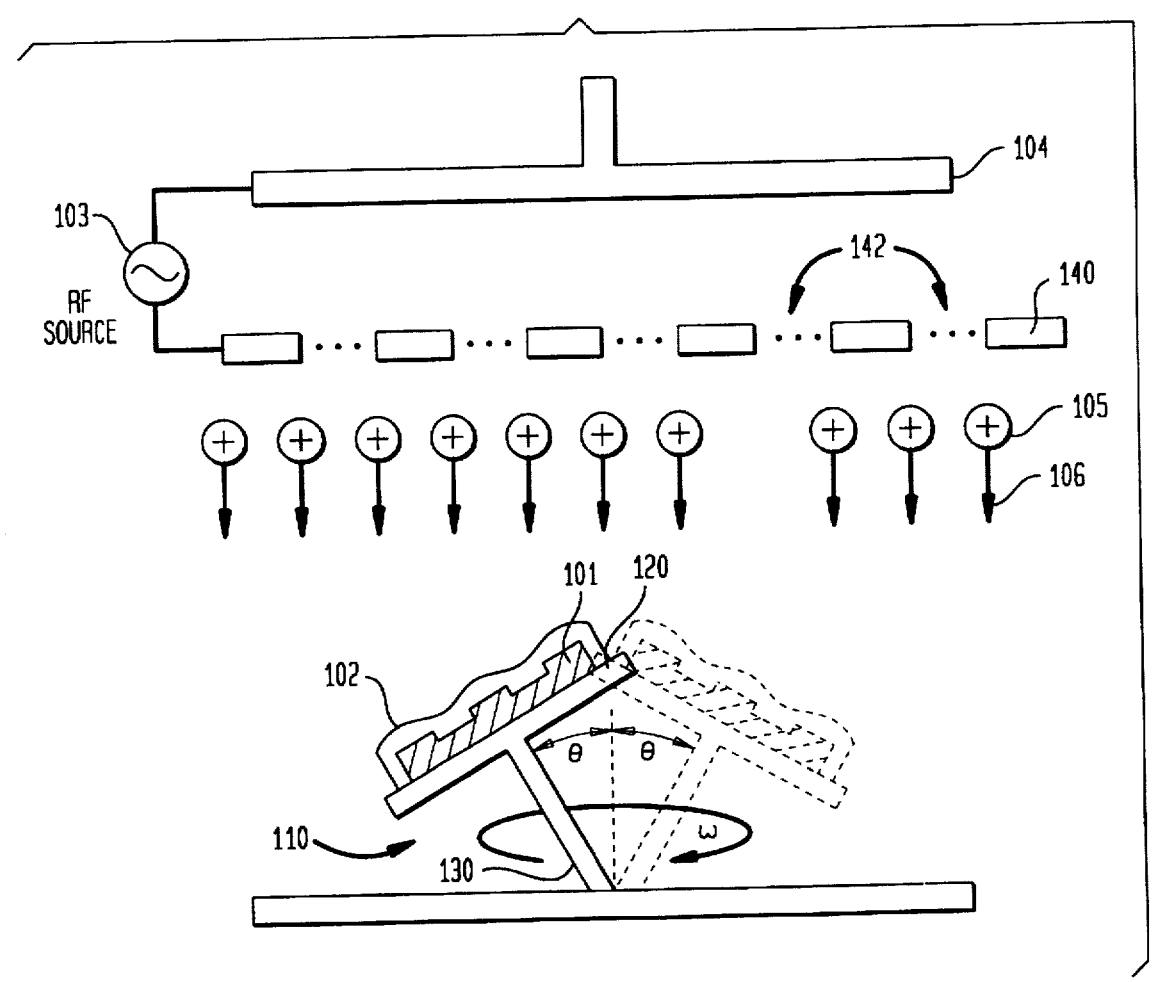
FIG. 4 illustrates the process of the present invention using plasma wherein the platform is located below the two electrodes.

In another embodiment shown in FIG. 4, instead of the platform 110 being situated between the two electrodes 104 and 140, the platform 110 is situated adjacent one of the electrodes, outside the space between the two electrodes 104 and 140. Illustratively, the platform 110 is situated adjacent to the electrode 140 which may be a grid or a cathode. In this case, the cathode 140 must have openings 142 so that the positive ions 105 traverse through the openings 142 and reach the substrate 101 in direction 106. Thereafter, the ions react with the substrate 101 and the layer 102 is deposited thereon.

Figure 5:
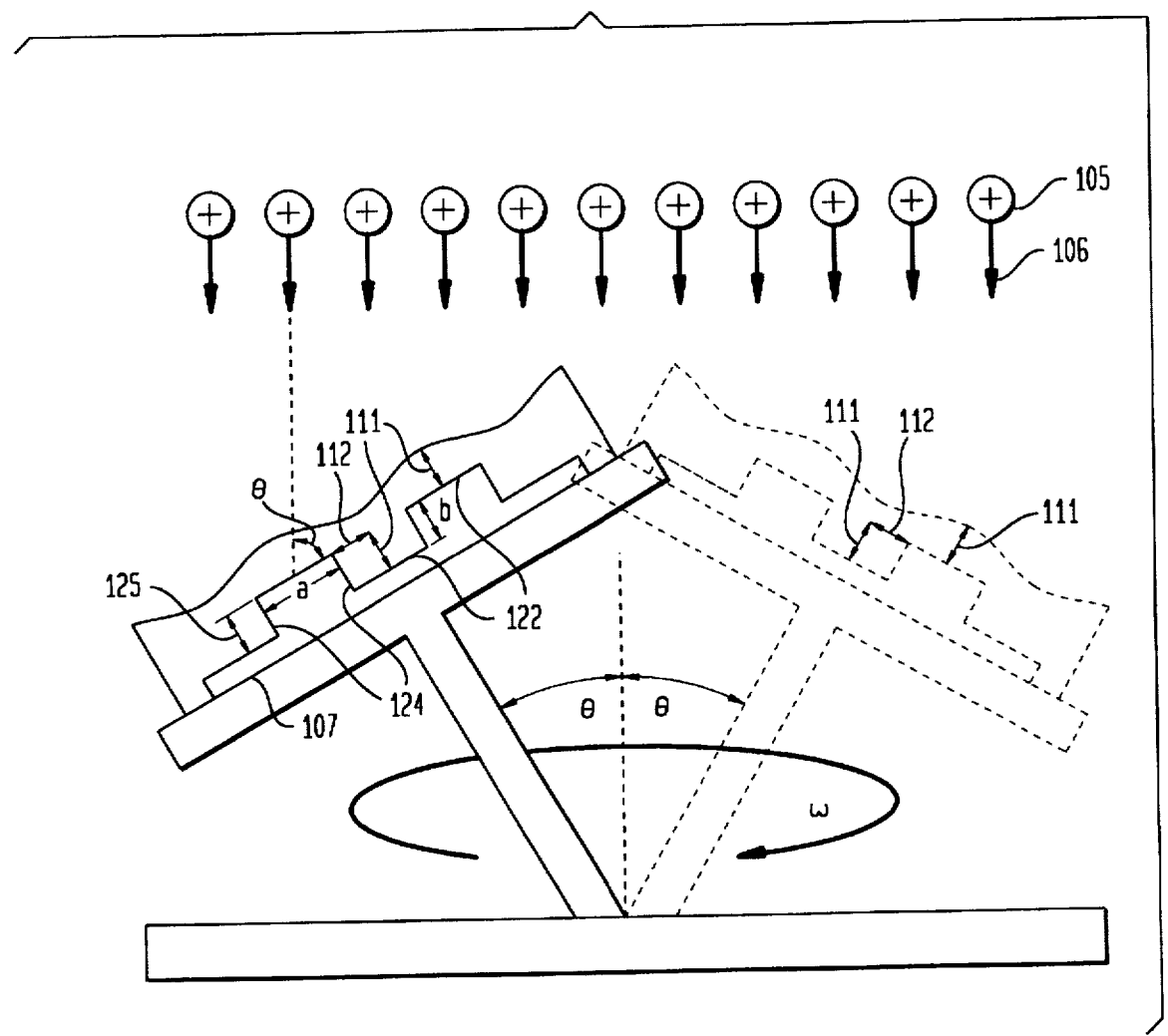
FIG. 5 illustrates the ion flow direction reaching a stepped surface forming a layer thereon.

As shown in FIG. 5, the surface of the substrate or semiconductor wafer 101 is a stepped surface 107 which has horizontal surfaces 122 and vertical sidewall surfaces 124. Illustratively, the horizontal distances "a" are larger than 0.1 microns and the vertical sidewall heights "b" are from 0.05 to 5 microns.

FIG. 5 shows the affect of tilting the stepped surface 107 at an angle θ and rotating it at angular velocity ω. The ions 105 flow in a direction 106 which is tilted by the tilt angle θ with respect to the horizontal surfaces 122 of the stepped surface 107. Therefore, the ions 105 reach the stepped surface 107 in various tilted directions 106 which result in proper step coverage and planarization.

Figure 6:
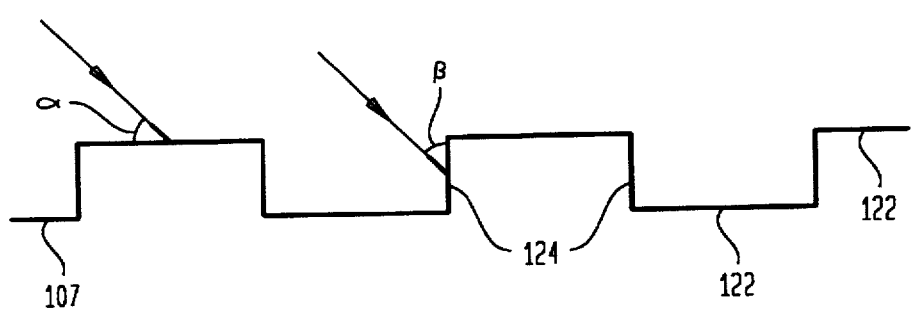
FIG. 6 illustrates the incident angles of the ions reaching the horizontal and vertical faces of the stepped surface.

As shown in FIG. 6, the incident angle α of the ions 105 reaching the horizontal surfaces 122 of the stepped surface 107 is approximately equal to the incident angle β of the ions 105 reaching the vertical sidewall surfaces 124. The incident angle α is equal to the tilt angle θ of the platform 110 shown in FIGS. 3–5. For example, for an uneven surface with horizontal and vertical surfaces, a tilt angle θ of 45 degrees results in approximately equal incident angles α and β each being about 45 degrees.

For uneven surfaces with irregular surfaces rather than perpendicular horizontal and vertical surfaces, the angle of incidence of the ions on these irregular surfaces is further equalized by varying the tilt angle θ as the platform 110 rotates.

Upon reaching the stepped surface 107, the ions 105 are neutralized during an ensuing chemical reaction which leads to the deposition of the layer 102 on the stepped surface 107.

Because the ions 105 reach all the surfaces of the stepped surface 107 at approximately the same incident angle, the layer 102 is deposited at an approximate even rate on both the horizontal surfaces 122 and the vertical sidewall surfaces 124. This yields a layer 102 of similar thickness throughout the stepped surface 107 resulting in proper coverage and planarization.

FIG. 5 shows the stepped surface 107 where the step 125 is properly covered with the layer 102. The thickness 111 of the layer above the horizontal surfaces 122 is similar to the thickness 112 of the layer adjacent the sidewall surfaces 124.

Illustratively, the above described elements could have the following characteristics. For example, the RF source 103 is a signal having a frequency of 13.8 KHz and a power of approximately 100 to 10,000 watts.

The substrate 101 placed on the surface 120 of the platform 110 is a semiconductor wafer having a thickness of approximately 200 to 2000 microns.

The device 131 used to tilt and rotate the platform 110 may be a motor and mechanical linkages for example. The tilt angle θ could be chosen from a range of 20 to 70 degrees, and the rotation rate is approximately 0.1 to 10 rotations per second in the clockwise or counter-clockwise direction about the axis 150 which is parallel to the direction of flow of the ions.

Illustratively, the ions 105 contain $N_2$ and Si and/or are doped with P/B, and reach the stepped surface 107 with an RF power of approximately 100 to 10,00 watts. The ions form the layer 102 which is $SiO_2$ on the stepped surface 107 which is silicon or metal, for example.

Figure 7:
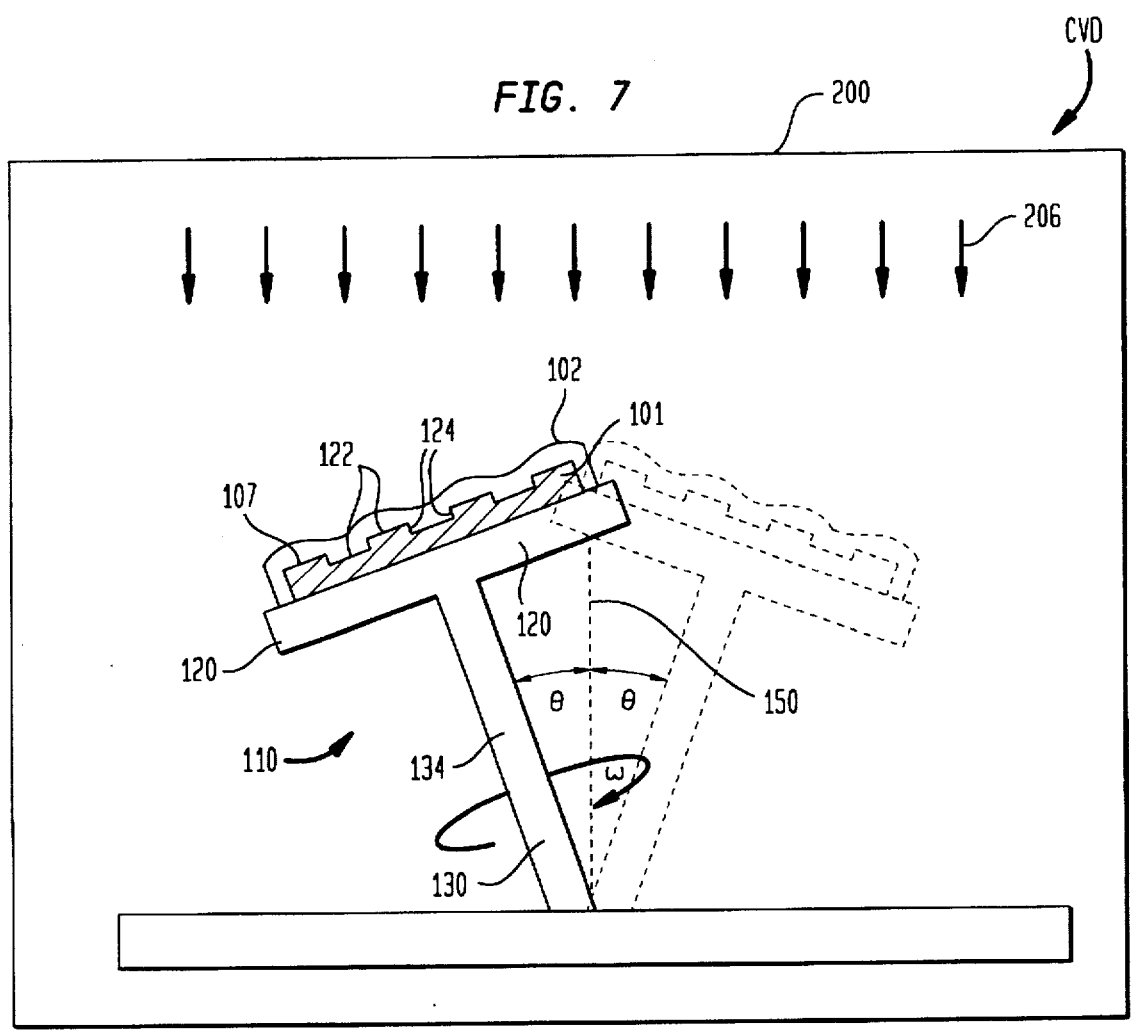
FIG. 7 illustrates the process of the present invention using chemical vapor deposition.

In yet another embodiment of the present invention, chemical vapor deposition (CVD) is used to deposit the layer 102 as shown in FIG. 7. The platform 110, with the stepped surface 107 mounted on the surface 120, is placed in a closed chamber 200 containing chemical vapor which flows in direction 206. As discussed above, the deposited layer 102 on the stepped surface 107 has a uniform thickness because the platform 110 is tilted and rotated.

The platform 110 is pivoted at the base 134 of its shaft 130 and is tilted by angle θ with respect to the direction of the chemical vapor flow. The tilt angle θ may be fixed or variable. Furthermore, as the chemical vapor 206 flows toward the stepped surface 107, the platform 110 rotates with angular velocity ω about an axis 150. The axis 150 is parallel to the direction of the chemical vapor flow. The dotted lines in FIG. 7 show the location of the platform 110 after a 180 degree rotation about the axis 150.

Because the stepped surface 107 is tilted and rotated, the chemical vapor flow reaches all areas of the stepped surface 107 at a similar angle of incidence and thus forms a layer 102 of uniform thickness.

The tilted shaft 130 is connected to a device (not shown) for rotating the shaft 130 at a tilt angle θ. The tilted surface 120, being connected to the shaft 130, rotates about the axis 150 at an angular velocity ω.

Illustratively, the chemical vapor is $SiO_2$ (Silane base or TEOS base). The rate of flow is approximately 0.1 to 100 lpm (liters per minute).

Figure 8:
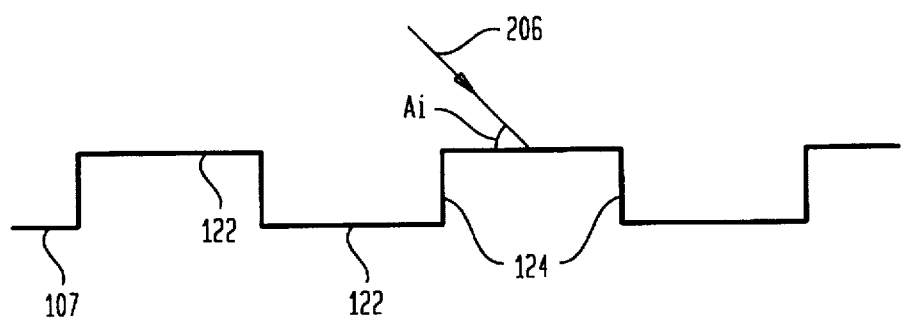
FIG. 8 illustrates the incident angle of the chemical vapor flow reaching the stepped surface.

As shown in FIG. 8, the rate of deposition of the chemical vapor flowing in direction 206 is proportional to the angle of incidence $A_i$. For example, if $A_i$ is 90 degrees, then the deposition rate is fastest. Whereas, if $A_i$ is almost equals to 0 degrees, then the deposition rate is slowest.

As shown in FIG. 7, by rotating the tilted stepped surface 107 in the manner described above, the incident angle of the chemical vapor reaching both the horizontal surfaces 122 and the vertical sidewalls 124 are similar. Therefore, the chemical vapor reacts equally with the horizontal and vertical surfaces of the stepped surface 107. Thus, a layer 102 is formed at a similar rate on the entire stepped surface 107, resulting in a layer 102 of similar thickness throughout the stepped surface 107.

Finally, the above-described embodiment of the present invention is intended to be illustrative only. Numerous alternative embodiments may be devised by those skilled in the art without departing from the spirit and scope of the following claims.

I claim:

1. An apparatus for forming a layer on a substrate with an uneven surface, the apparatus comprising:

a source of a stream of ions having a particular flow direction, and a rotatable platform, on which said substrate is mounted, disposed in said stream of ions and tilted with respect to a rotation axis of said rotatable platform, said rotation axis being parallel to said flow direction, wherein said rotatable platform is connected to precess around said rotation axis along a conical path.

2. An apparatus for forming a layer on a substrate with an uneven surface, the apparatus comprising:

a source of a stream of particles having a particular flow direction, and a rotatable platform, on which said substrate is mounted, disposed in said stream of particles and tilted with respect to a rotation axis of said rotatable platform, said rotation axis being parallel to said flow direction, wherein said rotation axis intersects a surface of said substrate off-center from a center of said substrate surface so that said substrate surface precesses about said rotation axis along a conical path.

* * * * *